(12) United States Patent
LaGraff et al.

(10) Patent No.: US 6,335,108 B1
(45) Date of Patent: Jan. 1, 2002

(54) IMPLANT-PATTERNED SUPERCONDUCTIVE DEVICE AND A METHOD FOR INDIRECT ION IMPLANTATION OF SUPERCONDUCTIVE FILMS

(75) Inventors: John R. LaGraff, Niskayuna, NY (US); Claire L. Pettiette-Hall, Torrance, CA (US); James M. Murduck, Redondo Beach, CA (US); Hugo W-K. Chan, Fremont, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/657,203

(22) Filed: Sep. 7, 2000

Related U.S. Application Data

(62) Division of application No. 09/314,772, filed on May 19, 1999, now Pat. No. 6,147,032.

(51) Int. Cl.[7] .......................... H01L 39/24; B32B 9/00; B32B 19/00
(52) U.S. Cl. .................. 428/689; 505/238; 505/325; 428/699; 428/701; 428/702; 428/930
(58) Field of Search .................. 428/688, 689, 428/699, 700, 701, 702, 930; 505/325, 730, 776, 777, 778, 779, 780, 782, 789, 238

(56) References Cited

U.S. PATENT DOCUMENTS

| | | |
|---|---|---|
| 4,093,503 A | 6/1978 | Harris et al. |
| 4,280,095 A | 7/1981 | Hinton |
| 4,470,190 A | 9/1984 | Fulton et al. |
| 4,536,781 A | 8/1985 | Kroger |
| 4,544,937 A | 10/1985 | Kroger |
| 5,051,396 A | 9/1991 | Yamazaki |
| 5,106,823 A | 4/1992 | Creuzet et al. |
| 5,137,868 A | 8/1992 | Yamazaki |
| 5,227,364 A | 7/1993 | Fujiwara et al. |
| 5,227,645 A | 7/1993 | Shinada |
| 5,250,506 A | 10/1993 | Saitoh et al. |
| 5,380,704 A | 1/1995 | Tarutani et al. |
| 5,401,716 A | 3/1995 | Yamazaki |
| 5,512,540 A | 4/1996 | Yamazaki |
| 5,547,922 A | 8/1996 | Ma |
| 5,795,848 A * | 8/1998 | Ma .......................... 505/162 |

* cited by examiner

Primary Examiner—Deborah Jones
Assistant Examiner—Jason Vincent V. de la Peña
(74) Attorney, Agent, or Firm—Connie M. Thousand

(57) ABSTRACT

An implant patterned superconductive device and a method for indirect implant-patterning of oxide superconducting materials is provided. The method forms a device having an oxide superconducting layer on a substrate, deposits a passivation layer atop the oxide superconducting layer, and implants chemical impurities in a selected portion of the superconducting layer through the passivation layer. This modifies the conductivity of the selected portion of the oxide superconducting layer and electrically isolates the selected portion from the non-selected portion of the oxide superconducting layer. The passivation layer is made of a material less susceptible to implant damage than the oxide superconducting layer to allow inhibition of the oxide superconducting layer while protecting the crystalline structure of the top surface of the oxide superconducting layer and keeping it planarized. The passivation layer is preferably a dielectric material having a crystal lattice structure which is compatible to that of the oxide superconducting layer. The method is especially efficient for the fabrication of devices with multiple layers of oxide superconductive materials because it does not degrade the epitaxial template's crystalline structure.

9 Claims, 3 Drawing Sheets

IMPLANT-PATTERNED SUPERCONDUCTIVE DEVICE AND A METHOD FOR INDIRECT ION IMPLANTATION OF SUPERCONDUCTIVE FILMS

This application is a divisional of U.S. Non-provisional Application No.: 09/314,772, filed May 19, 1999, now U.S. Pat. No. 6,147,032.

BACKGROUND OF THE INVENTION

This invention relates generally to the field of implant-patterning oxide superconductive material, and more specifically pertains to a method for manufacturing implant-patterned superconducting devices by ion implantation of superconducting films through a passivation layer.

The methods for fabrication of integrated circuits based on high critical temperature oxide superconductive (HTS) films have evolved rapidly over the past several years. But, further improvements of fabrication technologies of HTS electronic devices are still necessary due to difficulties in obtaining epitaxial insulating layers and providing reliable patterning processes, especially for multi-layered devices.

Patterning can be accomplished by any appropriate process, such as conventional photolithography and dry etching. For fabrication of YBaCuO (YBCO) and similar HTS integrated circuits, the current technology involves patterning a YBCO film with photoresist followed by ion-milling areas of the film not covered by photoresist, to remove material and form different structures, such as YBCO lines. Complicated three-dimensional architectures are constructed by removing the photoresist, depositing additional films, additional patterning with photoresist, ion-milling, etc.

Other suitable patterning methods for production of implanted pattern regions include introduction of impurities into a superconductor by planar diffusion techniques and ion implantation processes. A superconductor may be ion implanted through an overlaying mask or by scanning the ion beam in a predetermined pattern. As contrasted with the diffusion process, in the ion implantation process, the number of implanted ions is controlled by the external system parameters, such as the ion source type and accelerating energy. The depth of penetration is a function of the kinetic energy of the impurity ions, the crystalline structure, and, the mass of the recipient atoms. Further, the implantation may be carried out at low temperatures at which the diffusion process cannot be performed. The ion implantation process can be used in combination with previously diffused device structures without affecting these prior structures.

Ion implantation has recently been used with HTS materials, such as YBCO materials, to obtain implant-patterned YBCO films by introduction of a reactive impurity, such as Si, to remove oxygen (O) from an oxide superconductor. Introduction of Si ions into a YBCO HTS material breaks down the Cu-O chemical bonds with the Si itself becoming oxidized to form an insulating oxide compound. The oxide superconductors include La—Sr—Cu—O, Ca—Sr—Cu—O, Y—Ba—Cu—O, Bi—Sr—Ca—Cu—O, Th—Ba—Ca—Cu—O, Hg—Ba—Ca—Cu—O, Bi—K—Ba—O, Nd—Ba—Cu—O, etc. The reactive impurity may be any one of the elements from the group of elements which are more reactive with oxygen than the element in the oxide superconductor (e.g. Cu, Ba). Elements such as Si, Th, Al, Mg, Sr, Ni, B, Ce, Ge, Fe, Zr, or Nb, and compounds such as $Si_3Ni_4$, $SiF_2$ or $SiF_3$ are suitable reactive impurities.

Studies reveal that chemical reactions between implanted Si ions and a YBCO material, and the consequential formation of Si oxide, inhibit the superconducting characteristics of HTS film causing the affected film portion to acquire an electrical insulating characteristic in place of its former superconducting characteristic. Accordingly, silicon can be used to pattern HTS YBCO films by locally inhibiting superconductivity in selected portions of the film.

However, consistent growth of good quality superconducting films on conventionally implanted YBCO layers has not been successful. One challenge encountered in developing a successful ion implantation patterning process for a multi-layer YBCO device is the inability to pattern micron-level superconducting lines which are electrically isolated from each other while, at the same time, maintaining the isolation and pattern definition after exposure to the high temperature anneals associated with additional depositions. In addition, with conventional technology it is difficult to efficiently grow epitaxial superconducting YBCO films on top of ion implant-patterned YBCO films because the crystalline template of the implanted YBCO film surface, required for additional growth, is often destroyed during the ion implantation process and newly-grown layers have large amounts of crystalline damage. As each ion is accelerated into the YBCO film and careens through the crystal lattice, it can create 100's to 1000's of vacancy and interstitial defects. In addition to this common form of implant damage, YBCO has a propensity to develop strain domains which are characterized by twinning. Further, ion implantation of YBCO films can cause the strain domains to migrate within the plane of the film which, in extreme cases, can lead to microcracking. Also, YBCO materials readily form undesirable secondary phases with the implanted ion species which can lead to surface buckling.

Therefore, there is a need for an efficient method for fabrication of superconducting patterns by ion implantation of a superconducting material at high production yields. The method should allow efficient fabrication of devices with multiple layers of superconductive materials without degradation of the superconductive material's crystalline structure.

SUMMARY OF THE INVENTION

The preceding and other shortcomings of prior art are addressed and overcome by various embodiments of the present invention, which consist of a superconductive implant-patterned device and a method for fabrication of superconducting patterns, circuits and devices by indirect ion implantation through a passivation layer.

One embodiment of the present invention is a method for implant-patterning oxide superconducting material to form the improved superconducting device of the present invention. According to this illustrated method, an oxide superconducting layer is formed on a substrate, a passivation layer is created atop the oxide superconducting layer, and chemical impurities are implanted in a selected portion of the oxide superconducting layer through the passivation layer. This modifies conductivity of the selected portion of the oxide superconducting layer and electrically isolates the selected portion from the non-selected portion of the oxide superconducting layer.

The passivation layer is made of material less susceptible to implant damage than the oxide superconducting layer, to allow inhibition of the oxide superconducting layer while protecting the crystalline structure of the top surface of the passivation layer. The resulting structure remains planarized allowing subsequent epitaxial growth. The passivation layer is preferably a dielectric material which has an in-plane crystal lattice structure similar to that of the oxide superconducting layer.

The method of the present invention is especially efficient for fabrication of devices with multiple layers of oxide superconductive material because it does not degrade the material's crystalline structure of the subsequent layers. In this embodiment of the present invention one or more additional epitaxial layers of oxide superconducting material are grown atop the passivation layer. Each epitaxial layer is isostructural and epitaxial with the oxide superconducting layer and has a plurality of lattice sites which are crystallographically identical to lattice sites of the oxide superconducting layer.

Elements to be added to superconducting layers for the purpose of converting the superconducting structure into insulating non-superconducting structure are preferably Ge, Si, $Si^{++}$, B, Ar, Ga, P, Ta, Mg, Be, Al, Fe, Co, Ni, Sr, Ce, Cr, Th, Ne, Nb, Mn and Zr, mixtures thereof, and $Si_3Ni_4$, $SiF_2$ or $SiF_3$ compounds and other chemical impurities. The oxide superconductors include La—Sr—Cu—O, Ca—Sr—Cu—O, Y—Ba—Cu—O, Bi—Sr—Ca—Cu—O, Th—Ba—Ca—Cu—O, Hg—Ba—Ca—Cu—O, Bi—K—Ba—O, Nd—Ba—Cu—O, and other materials.

Another embodiment of the present invention is an improved superconductive implant-patterned device of oxide superconducting material, manufactured by the illustrated method for indirect implant patterning of superconducting circuits.

The foregoing and additional features and advantages of the present invention will become further apparent from the following detailed description and accompanying drawing figures that follow. In the figures and written description, like numerals indicate the various features of the invention, like numerals referring to like features, throughout for the drawing figures and the written description.

DETAILED DESCRIPTION OF THE INVENTION

The following description is provided to enable any person skilled in the art to make and use the invention and sets forth the best modes contemplated by the inventors of carrying. out their invention. Various modifications, however, will remain readily apparent to those skilled in the art, since the general principles of the present invention have been defined herein with specificity.

As mentioned previously, YBCO and other oxide superconducting materials are susceptible to several types of ion implantation damage. This makes such materials extremely difficult to implant-pattern and grow additional epitaxial films in subsequent multi-layer processing. As a solution to this problem, the present invention provides a method for inhibiting the superconducting characteristic of a selected portion of a high critical temperature oxide superconducting (HTS) film or a single crystal by implantation of impurity ions through a passivation layer previously deposited on the HTS material. The method preserves the crystalline structure of the film surface and thereby enables epitaxial growth of HTS multi-layer structures.

Figure 1:
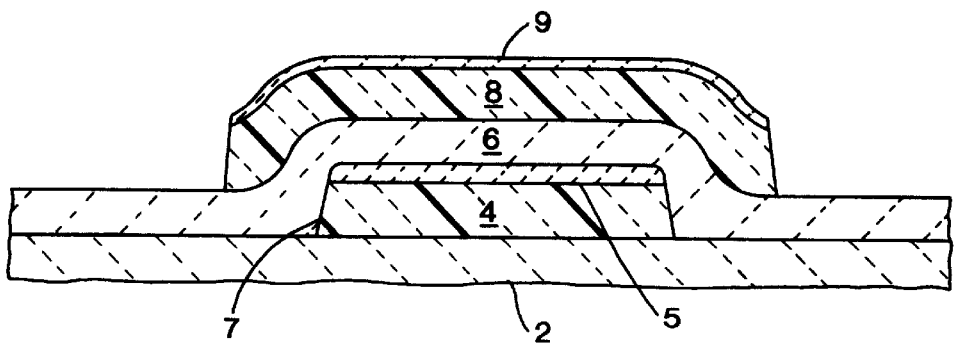
FIG. 1 illustrates a greatly enlarged cross-sectional view of a result of ion-mill patterned YBCO multi-layer processing, according to the prior art.
Figure 2:
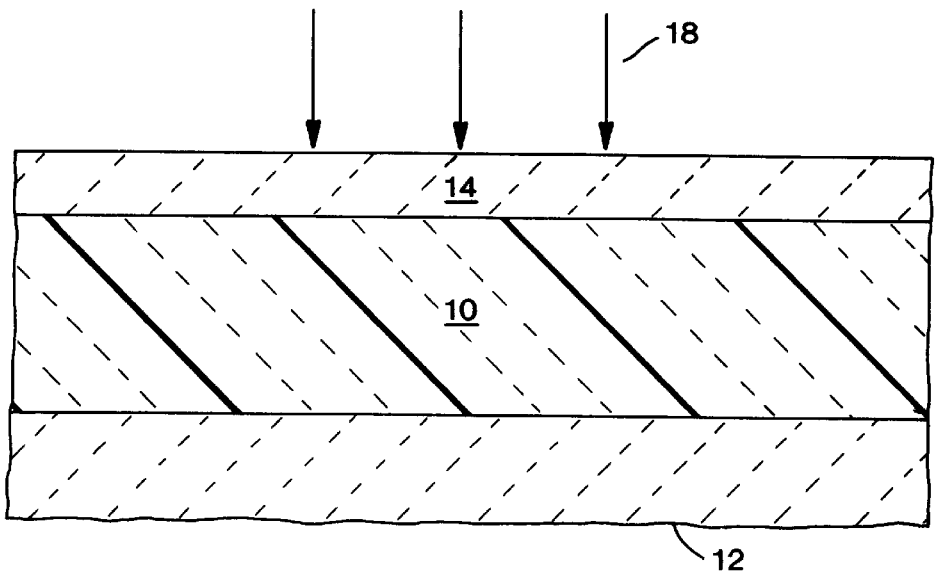
FIG. 2 illustrates a method for indirect ion implantation of YBCO through a protective STO passivation layer, in accordance with the present invention.
Figure 3:
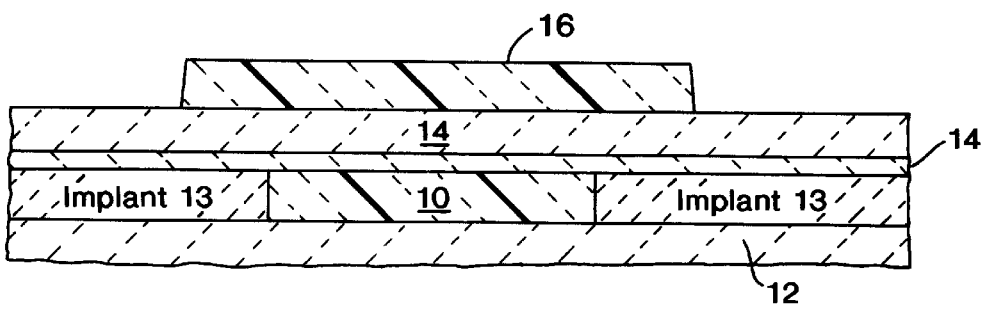
FIG. 3 illustrates a greatly enlarged cross-sectional view of the result of indirect implant-patterned YBCO multi-layer processing, in accordance with the present invention.

FIGS. 1, 2 and 3 compare the results obtained with a conventional ion-mill patterning method and the ion implant patterning method of the present invention. FIG. 1 illustrates a greatly enlarged cross-sectional view of the result of an ion-mill patterned YBCO multi-layer process, according to the prior art. A first YBCO layer 4 is grown on a substrate 2, a $SrTiO_3$ (STO) passivation layer 5 is grown atop the first YBCO layer 4, a second STO passivation layer 6 is grown atop the first STO passivation layer 5 and over the angled edge 7 formed by the first YBCO layer 4 and the first STO layer 5. A second YBCO layer 8 is grown atop a portion of the second STO layer 6 and a third STO layer 9 is grown atop the second YBCO layer 8.

FIG. 2 illustrates the method for indirect ion implantation of an HTS material through a protective STO passivation layer in accordance with the present invention. An oxide superconducting layer 10, which is an HTS material film or a single crystal, is preferably made of a YBCO material and is placed on a substrate 12 and passivated with a passivation layer 14. The passivation layer 14 is preferably made of material less susceptible to implant damage, such as strontium tritanate $SrTiO_3$ (STO). Ion implantation 18 is performed through the passivation layer 14 to inhibit the underlying YBCO layer 10. Since the passivation layer 14 is less susceptible to implant damage than a bare YBCO layer by itself, it is easier to grow an additional epitaxial film on the passivation layer 14 surface. The passivation layer 14 is preferably a dielectric film made from a suitable dielectric material (such as $SrTiO_3$, $CeO_2$, $LaAlO_3$, etc.), having an in-plane lattice structure compatible to that of the HTS material employed in the YBCO layer 10.

FIG. 3 illustrates a greatly enlarged cross-sectional view of an HTS material which is formed with an indirect implant-patterned YBCO multi-layer process, in accordance with the present invention. It can be seen that ion implantation 18 of the first YBCO layer 10 through the STO passivation layer 14 results in the ability to modify the first YBCO layer 10 from superconducting to insulating through the STO passivation layer 14, and allows a subsequently deposited superconducting layer 15, such as a second YBCO layer 15, to remain planar thereby removing low critical currents and electrical discontinuities often found in YBCO films deposited over angled edges 7 (FIG. 1) obtained by conventional methods.

The method embodiments of the present invention provide inhibition of superconductivity in selected portions of the superconducting layer 10 for creating an insulating implanted layer 13 at a selected depth within the superconducting layer 10. The illustrated method is further applicable whenever the implanted pattern 13 should have electrical characteristics different from those of the oxide superconducting layer 10, such as insulating, metallic, or weak superconductor characteristics, and whenever a very thin layer of insulating, conductive or slightly superconductive material has to be placed between the two elements, such as electrodes. Further, the preferred method of the present invention may be used to make thin resistors, where relatively high or low resistance values are required, such as resistors 21, 23 of FIG. 5. In many electronic circuits, close control of a pattern's resistance is critical, but resistance values are difficult to control in fabrication. Since, in the present invention, ions are implanted in the superconducting thin film by irradiation with ion beams, it is possible to control the resistance by controlling the depth to which ions enter. This is accomplished-by controlling the accelerating energy of ions and by varying the type and dosage of the implanted gaseous element.

The present invention is applicable to high Tc oxide superconducting materials which have at least one rare earth (Re) element and superconduct at a high critical temperature. Referring back to FIG. 2, with the method of the present invention, when chemical impurity ions 18, are implanted in a selected portion of the oxide superconducting layer 10, they cause the selected portion of the oxide superconducting layer 10 to lose its electrical conductivity without degrading the passivation material's crystalline structure. Thus, this method allows growth of an epitaxial film 15 (FIG. 3) on top of the inhibited portion at a high production level and free of significant damage, thereby providing an effective way of patterning multi-layer HTS devices and circuits. With this method, it is possible to obtain a device which has the right crystal structure on either side of the passivation layer 14 to within a distance of about one elementary lattice constant.

Figure 4:
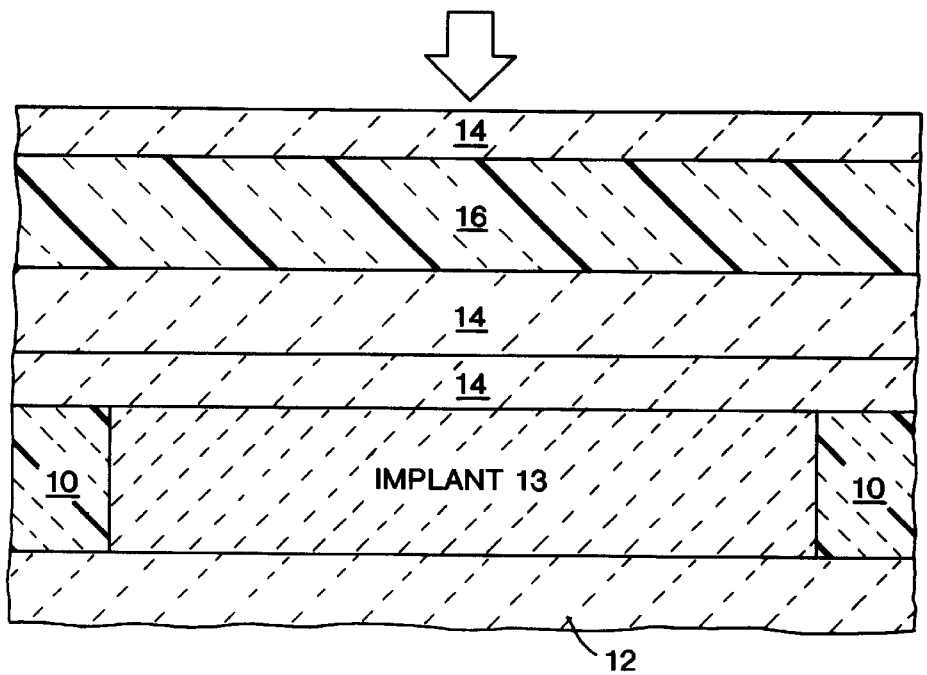
FIG. 4 is a cross-sectional view of a multi-layer structure having two layers of STO and two layers of HTS superconducting material, in accordance with the present invention.
Figure 5:
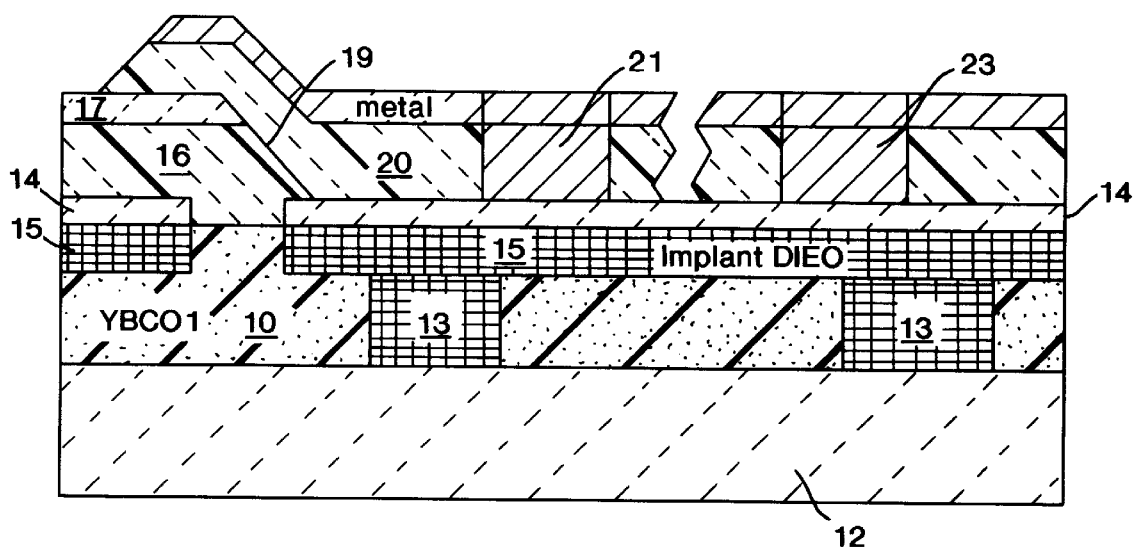
FIG. 5 is a cross-sectional view of a fully processed implant-patterned multi-layer HTS superconducting structure, in accordance with the present invention.

The invention further provides an improved multi-layer superconducting device and a method for making the efficient multi-layer HTS device structures. FIG. 4 is a cross-sectional view of a multi-layer structure having two layers of STO materials 14 and two layers of HTS superconducting materials 10, 16, in accordance with the present invention. FIG. 5 is a cross-sectional view of a fully processed implant-patterned-multi-layer HTS superconducting structure, in accordance with the present invention.

Referring to FIGS. 2, 4, and 5, in an exemplary method for manufacturing patterned multi-layer HTS devices and circuits, the superconducting layer 10 is initially deposited on the substrate 12 by screen printing, sputtering, Molecular Beam Epitaxial (MBE), CVD, PLD or any other method known in the art to deposit a superconducting layer 10. The oxide superconducting layer 10 may be an HTS film or a single crystal. The passivation layer 14 in this embodiment is formed over the oxide superconducting layer 10 and is preferably an insulating material, having a similar in-plane crystal structure as the underlying superconducting layer 10. For the ion implantation step, a mask (not shown), bearing a pattern which prevents impurity ions from passing through the selected portions, may be applied to the passivation layer 14. The passivation layer 14 is then subjected to impurity ion 18 bombardment to implant impurity ions 18 into the selected portions of the superconducting layer 10, at an energy level sufficient for the selected depth. In this manner, ion implantation of the oxide superconducting layer 10 is performed through the passivation layer 14.

The method of the present invention may further be used to provide interconnected multi-layer HTS structures, where a first and second inhibited region in each superconducting layer are selected such that the first inhibited region contacts the second inhibited region, or such that a non-inhibited region of a superconducting layer is connected with a non-inhibited region of another superconducting layer. FIG. 5 shows a multi-layer HTS structure fabricated in accordance with this embodiment which includes a first oxide superconducting layer 10, a second oxide superconducting layer 16, and a third oxide superconducting layer 20. The first oxide superconducting layer 10 consists of a superconducting region and several insulating or inhibited implanted regions 13, 15, which are created by patterned impurity ion implantation through the STO passivation layer 14, as described above in relation to FIG. 2. After the fabrication of the implanted regions 13, 15, contacts to the first superconducting layer 10 are milled through the STO passivation layer 14, and the second oxide superconducting layer 16 is grown epitaxially atop the STO passivation layer 14. This HTS layer 16 is isolated from the superconducting layer 10 by the insulating regions 15. In this particular sample, the HTS layer 16 is patterned by ion milling to form SNS edge junctions 19 with the superconducting layer 20. Low 21 and high 23 value resistors are fabricated by selective ion implantation where the high value resistor 23 can be formed in any of the superconducting layers.

All of the foregoing method embodiments of the present invention can be applied to HTS films or single crystal structures of arbitrary thickness. Although the oxide superconducting material used in these embodiments is preferably a YBCO material, the application of the invention to the YBCO type of oxide superconductor has been given purely by way of example, and the present invention is applicable to (Re) Ba—Cu—O, La—Sr—Cu—O, Ca—Sr—Cu—O, Bi—Sr—Ca—Cu—O, Th—Ba—Ca—Cu—O, Hg—Ba—Ca—Cu—O, Bi—K—Ba—O, Nd—Ba—Cu—O, and other such materials.

In the present invention ion implantation for forming the implanted layer 13 is preferably performed with implantation species of Ge, Si, $Si^{++}$, B, Ar, Ga, P, Ta, Mg, Be, Al, Fe, Co, Ni, Sr, Ce, Cr, Ti, Ne, Nb, Mn and Zr, mixtures thereof, $Si_3Ni_4$, $SiF_2$ or $SiF_3$ compound or other chemical impurities, which are projected from above the passivation layer 14 and through the passivation layer 14 and the oxide superconducting layers 10, 16, 20, as shown in FIGS. 2, 4 and 5. The oxide superconducting layers 10, 16, 20 are irradiated at a preselected accelerating energy. The higher the energy level, the greater the ion implantation depth. To obtain a uniform concentration of impurities over a wide range of depths, multiple ion bombardment steps may have to be used, with each step employing a different ion energy level.

The implanted portions 13 of the superconducting layer 10 lose their superconducting characteristics at the selected depth, but such characteristics are preserved in the other portions of the superconducting layer 10 in which the mask has shielded the superconducting layer 10 from the impurity ions. In this manner the HTS material's crystalline structure is preserved so additional layers can be epitaxially grown atop the inhibited material.

The primary advantages of indirect ion implantation patterning of oxide superconducting material, such as a YBCO material, performed according to the present invention, includes planarization of the patterned film, sharper feature definitions, chemical stability of the patterned structure edges, and efficient control of the electrical properties of the patterned layers. Further, since the STO passivation layer 14 is not a ferroelastic material, it does not twin and the STO passivation layer 14 can easily resist the in-plane strain of the YBCO layer 10 during implantation. The STO layer 14 allows the superconducting layer 10 to be implanted while serving as a better template for additional depositions. In addition, there is less crystalline damage in STO passivation layer 14 as fewer vacancies are formed during implantation in the STO passivation layer 14 than in the YBCO layer 10. Also, the implanted STO passivation layer 14 does not recrystallize to form secondary phases as much as the YBCO layer 10 does.

Referring back to FIG. 1, dry etching of the YBCO material by a conventional ion-milling method of the prior art yields angled edges 7 which are 0.1 $\mu$m to 1 $\mu$m wide, which consumes valuable chip space and increase circuit parasitic inductance. In contrast, an implant-defined region obtained with the present invention typically has sharp boundaries, as shown in FIG. 2, with a width less than 0.1 $\mu$m allowing more elements to be patterned on a given chip and reducing parasitic inductance. Further, the implanted interfaces of the present invention have greater chemical stability because they are not exposed to potentially corrosive external ambients, such as water vapor and chemicals, associated with photolithography which is important for long term reliability of YBCO circuits. In addition, in the present invention the implant type and dose can be chosen to control the electrical properties of the implanted YBCO layers over a wide range of conductivities. For example, low dose Ni implantation could be used to fabricate integrated high and low value resistor 21, 23 (FIG. 5) on Ag/YBCO bi-layers.

Figure 6A:
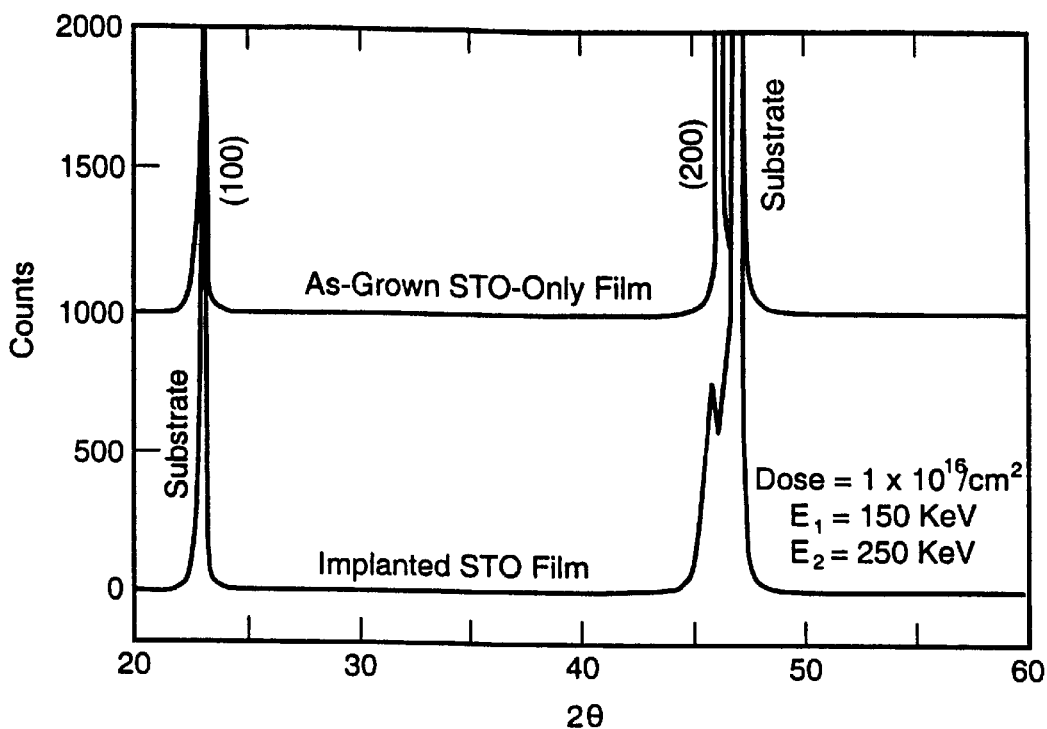
FIG. 6a illustrates x-ray diffraction patterns of as-grown and implanted STO-only films.
Figure 6B:
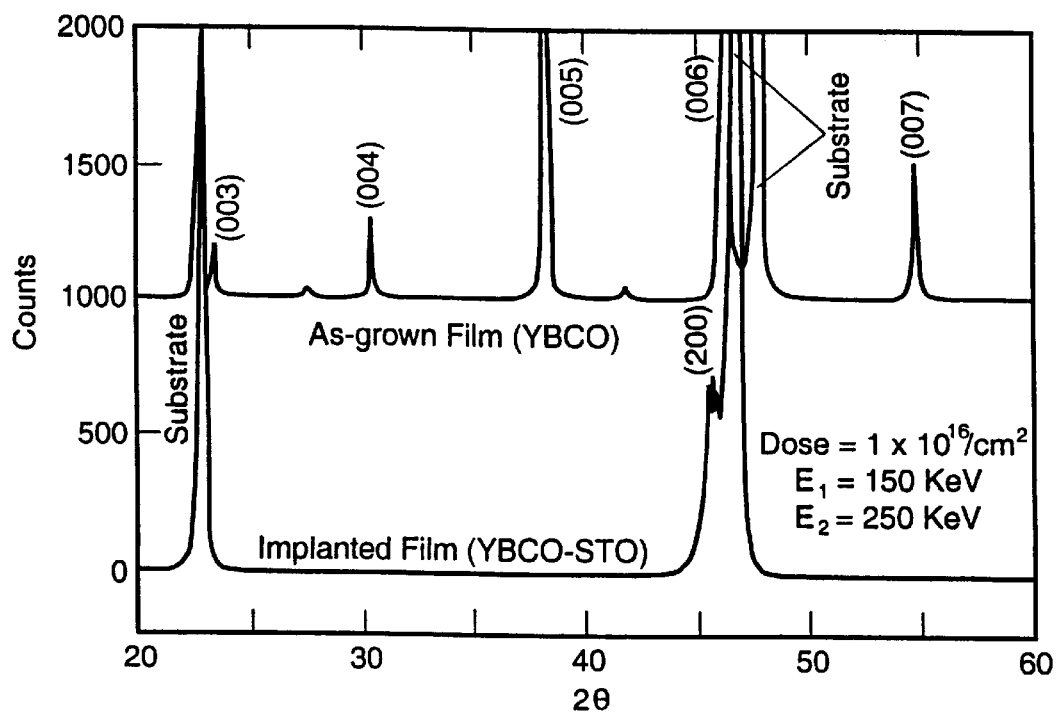
FIG. 6b illustrates x-ray diffraction patterns of as-grown, YBCO-only films and implanted YBCO1/STO films.

STO materials posses some additional advantages because it is a cubic material and hence does not form stress domains, which can lead to microcracking, and does not form secondary phases as readily as YBCO. This all indicates that an implant damage-resistant material, such as STO, serves as a better crystalline template for additional film growth in comparison to implanted YBCO-only films. Calculations reveal that a fewer number of vacancies per Si ion, as a function of implant energy, are formed in materials with densities lower than the density of a YBCO material, such as in the STO films of the present invention, indicating that STO is less damaged by ion implantation. This suggests that an STO material better retains its crystalline structure, and hence the surface template, required for additional epitaxial growth. FIGS. 6a and 6b illustrate that an STO layer is less damaged by ion implantation than is a YBCO layer. FIG. 6a shows representative diffraction patterns of an as grown STO-only film and an implanted STO-only film total dose $=(1\times10^{16}/cm^2$; $E_1=150$ KeV, $E_2=250$ KeV). A weak (200) STO peak remains indicating that STO still possesses some crystalline order after ion implantation. FIG. 6B shows a YBCO-only film as-grown and as-implanted YBCO/STO film after implantation at the same dose and energy as the STO-only film (FIG. 6a). However, for implanted YBCO/STO, the same (200) STO peak is present as in FIG. 6a, while the YBCO film has lost all of its crystallinity as indicated by the absence of all (00l) diffraction peaks where l =3 to 7. This indicated that STO is less susceptible to implantation damage than YBCO.

The method of the present invention can be used to manufacture superconducting patterns and superconducting devices easily and at high production yields by small modifications of the currently-available photolithographic technology for patterning thin films and crystals of HTS materials. The method can be used for fabrication of digital circuits, RF applications, magnetometers, integrated circuits, and other devices. The advantages of the preferred method of the present invention are especially significant in manufacturing multi-layered devices, such as HTS SQUID magnetometers, which may require as many as 15 epitaxial layers.

While this invention has been described with reference to its presently preferred embodiment(s), its scope is only limited insofar as defined by the following set of claims and all equivalents thereof. It is quite clear that the above description has been given purely by way of a non-restrictive example. The digital values have been given purely to illustrate the description. Those skilled in the art will appreciate that various adaptations and modifications of the described preferred embodiments can be configured without departing from the scope and spirit of the invention. Therefore, it is to be understood that, within the scope of the appended claims, the invention may be practiced otherwise than as specifically described herein.

What is claimed is:

1. An implant-patterned multi-layer superconductive device comprising:

a first layer of oxide superconductive material formed on a substrate and having a crystal structure and high superconducting transition temperature; and, a passivation layer made of a material which can be implanted through and superposed with respect to said first layer of oxide superconductive material for facilitating ion implant-patterning of a selected portion of the first layer of oxide superconductive material with chemical impurities through said passivation layer In order to modify conductivity of said selected portion of the first layer of oxide superconducting material to electrically isolate said selected portion from a non-selected portion of the first layer of oxide superconducting material.

2. The device of claim 1, further comprising a second layer of oxide superconductive material formed atop said passivation layer.

3. The device of claim 2, wherein said first layer of oxide superconductive material has a top surface, and said passivation layers are made of materials less susceptible to implant damage than the first layer of oxide superconductive material to allow inhibition of the first layer of oxide superconductive material while protecting the crystalline structure of the top surface of the passivation layer material and keeping it planarized.

4. The device of claim 3, wherein said chemical impurities are selected from the group consisting of Si, Ge, B, Ar, Ga, P, Ta, Mg, Be, Al, Fe, Co, Ni, Sr, Ce, Cr, Ti, Ne, Nb, Mn and Zr, mixtures thereof, and $Si_3Ni_4$, $SiF_2$ and $SiF_3$ compounds.

5. The device of claim 4, wherein said first layer of oxide superconductive material is selected from the group consisting of Y—Ba—Cu—O, La—Sr—Cu—O, Ca—Sr—Cu—O, (Re) BaCuO, Bi—Sr—Ca—Cu—O, Ti—Ba—Ca—Cu—O, Hg—Ba—Ca—Cu—O, Bi—K—Ba—O, and Nd—Ba—Cu—O.

6. The device of claim 5, wherein said second layer of oxide superconductive material comprises an epitaxial layer isostructural and epitaxial with said first layer of oxide superconductive material, and having a plurality of lattice sites crystallographically identical to lattice sites of said first layer of oxide superconductive material.

7. The device of claim 6, wherein said passivation layer comprises a dielectric material having an in-plane crystal lattice structure compatible to that of the first layer of oxide superconducting material.

8. The device of claim 1, wherein the passivation layer has a top surface, the passivation layer being made of a material which is substantially immune to ion-implantation damage to allow inhibition of the first layer of the oxide superconductive material through the passivation layer substantially free of damage to the top surface of the passivation layer.

9. The device of claim 1, wherein said first layer of oxide superconductive material has a top surface and said passivation layer is made of a material less susceptible to implant damage than the first layer of oxide superconductive material to allow inhibition of the first layer of oxide superconductive material while leaving substantially free of damage the crystalline structure of the top surface of the passivation layer during ion-implant patterning.

* * * * *